(12) United States Patent
Lambertini et al.

(10) Patent No.: US 7,075,229 B2
(45) Date of Patent: Jul. 11, 2006

(54) LIGHT-EMITTING DEVICE COMPRISING POROUS ALUMINA, AND CORRESPONDING METHOD OF FABRICATION

(75) Inventors: Vito Lambertini, Giaveno (IT); Nello Li Pira, Fossano (IT); Piermario Repetto, Turin (IT)

(73) Assignee: C.R.F. Societa Consortile per Azioni, Orbassano (IT)

( * ) Notice: Subject to any disclaimer, the term of this patent is extended or adjusted under 35 U.S.C. 154(b) by 262 days.

(21) Appl. No.: 10/626,699

(22) Filed: Jul. 25, 2003

(65) Prior Publication Data
US 2004/0150979 A1    Aug. 5, 2004

(30) Foreign Application Priority Data
Jul. 26, 2002    (IT)    .......................... TO2002A0670

(51) Int. Cl.
*H01J 1/62*    (2006.01)
(52) U.S. Cl. ........................................ 313/506; 313/503
(58) Field of Classification Search ......... 313/504–506
See application file for complete search history.

(56) References Cited
U.S. PATENT DOCUMENTS
5,093,691 A * 3/1992 Utsugi et al. ................ 257/40

OTHER PUBLICATIONS

Gaponeko N V, Molchan L S, Thomson G E, Lambertine V, Repetto P: "High-efficiency luminescent sources fabricated in mesomorphous anodic alumnia by sol-gel synthesis" J. Soc. Inf. Disp. (USA), Journal of the Society for Information Display, vol. 11, No. 1, Sep. 18-21, 2001, pp. 27-32, XP009018574 *p. 27-p. 32; figures 1-9*.
Kukhta A V, Kolesnik E E, Shakah G H, Taoubi M I, Mozalev A V: "Porous alumnia based cathode for organic light-emitting devices" Proc SPIE Int Soc Opt Eng; Proceedings of SPIE—The Internationalsociety for Optical Engineering, vol. 4105, Jul. 31, 2000—Aug. 2, 2000, pp. 405-412, XP0009018639.

(Continued)

*Primary Examiner*—Joseph Williams
(74) *Attorney, Agent, or Firm*—Sughrue Mion, PLLC

(57) ABSTRACT

A light-emitting device, in particular a backlight device, comprises a transparent substrate (2) having a front surface and a rear surface, in which associated to the rear surface are means for generating an electromagnetic radiation that is able to pass through the substrate and come out of the front surface. According to the invention, the device comprises a layer of porous alumina which operates so as to inhibit propagation of said electromagnetic radiation in the directions parallel to the plane of the substrate, thus improving the efficiency of extraction of light from the substrate and increasing the directionality of the emitted light.

15 Claims, 2 Drawing Sheets

OTHER PUBLICATIONS

Gaponenko NV, Molchan I S, Thomson G E, Skeldon P, Pakes A. Kudrawiec R, Bryja L, Misiewicz J: "Photoluminescence of Eu-doped titania xerogel spin-on deposited on porous anodic alumina" E-MRS Proceedings of Symposium J: Materials in Microtechnologies and Microsystems, vol. A99, No. 1-2, Jun. 5-8, 2001, pp. 71-73, XP002257065 Strassburg, France *p. 71-p.73; figures 1,2*.

Thijssen MS, Sprik R, Wijnhoven J E G J, Megens M, Narayanan T, Lagendijk A, Willem L V: "Inhibited light propagation and broadband reflection in photonic air-sphere crystals" Physical Review Letters, vol. 83, No. 14, Oct. 4, 1999, pp. 2730-2733, XP002257066 * p. 2730-p. 2733; figures 1-5 *.

Masuda H et al: "Photonic Crystal Using Anodic Porous Alumina" Japanese Journal of Applied Physics, Publication Office Japanese Journal of Applied Ohysics. Tokyo, JP, vol. 38, No. 12A, Part 2, Dec. 1, 1999, pp. L1403-L1405, XP000890833 ISSN: 0021-4922 * p. 405-p. 412; figures 1-7 *.

* cited by examiner

LIGHT-EMITTING DEVICE COMPRISING POROUS ALUMINA, AND CORRESPONDING METHOD OF FABRICATION

BACKGROUND OF THE INVENTION

The present invention relates to light-emitting devices, for example of the backlight type, which comprise a transparent substrate having a front surface and a rear surface, there being associated to the rear surface means for generating a light radiation which is able to pass through the substrate and come out of the front surface.

SUMMARY OF THE INVENTION

The purpose of the present invention is to provide backlight devices and systems in which the visible electromagnetic radiation produced by a light source can be directed in an optimal way.

The above purpose is achieved, according to the present invention, by a light-emitting device, in particular of the backlight type, of the kind comprising a transparent substrate having a front surface and a rear surface, there being associated to the rear surface means for generating an electromagnetic radiation that is able to pass through the substrate and come out of the front surface, said device being characterized in that it comprises a layer of porous alumina which operates so as to inhibit propagation of said electromagnetic radiation in the directions lying in the plane of the substrate, thus improving the efficiency of extraction of light from the substrate and increasing the directionality of the emitted light. Preferred characteristics of the device according to the invention and of its method of fabrication are indicated in the annexed claims, which are intended as forming an integral part of the present description.

BRIEF DESCRIPTION OF THE DRAWINGS

Further purposes, characteristics and advantages of the present invention will emerge clearly from the ensuing detailed description and from the annexed drawings, which are provided purely by way of explanatory and non-limiting example, and in which.

DETAILED DESCRIPTION OF THE INVENTION

Figure 1:
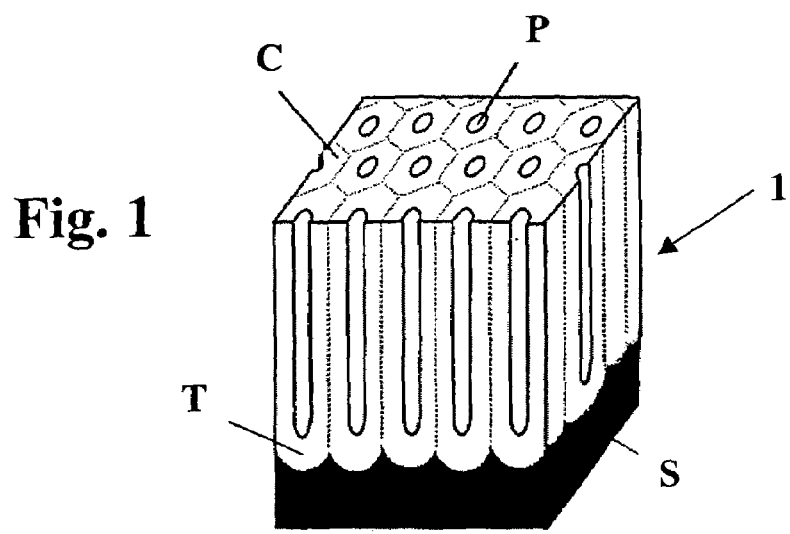
FIG. 1 is a schematic perspective view of a portion of a film of porous alumina of nanometric dimensions.

The present invention is based upon recognition of the fact that particular photonic-crystal structures can be combined with light sources used as backlight in applications in the field of displays and systems for illumination in order to direct light radiation in an optimal way.

The theory underlying photonic crystals originates from the works of Yablonovitch and results in the possibility of obtaining materials with characteristics such as to influence the properties of photons, as likewise semiconductor crystals influence the properties of electrons.

In 1987, Yablonovitch demonstrated that materials the structures of which present a periodic variation of the refractive index can modify drastically the nature of the photonic modes within them. This observation has opened up new perspectives in the context of control and manipulation of the light-transmission and light-emission properties of matter.

In greater detail, the electrons that move in a semiconductor crystal are affected by a periodic potential generated by the interaction with the nuclei of the atoms that constitute the crystal itself. This interaction results in the formation of a series of allowed energy bands, separated by forbidden energy bands.

A similar phenomenon applies to photons in photonic crystals, which are generally made up of blocks of transparent dielectric material containing an orderly series of microcavities in which there is trapped air or another means having a refractive index very different from the one of the host matrix. The difference between the refractive indices causes confinement of photons with given wavelengths within the cavities of the photonic crystal.

The confinement that photons (or electromagnetic waves) undergo on account of the difference between the refractive indices of the porous matrix and of the cavities thus results in the formation of regions of allowed energies, separated by regions of forbidden energies. The latter are referred to as "photonic band gaps" (PBGs). From this fact, there follow two fundamental properties of photonic crystals:

i) by controlling the dimensions, the distance between the microcavities, and the difference between refractive indices, it is possible to prevent propagation and spontaneous emission of photons of given wavelengths; and ii) as in the case of semiconductors, if dopant impurities are present, within a photonic band gap it is possible to create allowed energy levels.

By appropriately selecting the values of the parameters defining the properties of photonic crystals, it is possible to prevent propagation and spontaneous emission of IR radiation of given wavelengths, and simultaneously enable propagation and spontaneous emission of visible radiation.

The properties of a photonic crystal are defined by the periodicity of the materials with different dielectric constants along one or more axes.

A further fact upon which the present invention is based is that porous alumina is particularly attractive as a PBG material for use in backlight applications.

In the past, films of porous alumina have attracted attention for applications such as dielectric films in aluminium capacitors, and films for retention of organic coatings and for protection of aluminium substrates.

Instead, in the case of the present invention, the fact that porous alumina provides an excellent two-dimensional photonic crystal, which is periodic along two of its axes and homogeneous along the third, is exploited. The structure of such a photonic crystal can be idealized as a lattice of hollow columns formed by air and embedded in an alumina matrix. Porous alumina can be obtained by means of anodization of sheets of high-purity aluminium or of aluminium films on substrates such as glass, quartz, silicon, etc.

FIG. 1 illustrates, purely by way of example, a portion of a film of porous alumina 1, obtained by means of anodic oxidation of a film of aluminium on a suitable substrate, designated by S. As may be noted, the layer of alumina 1 is formed by a series of hexagonal cells C directly adjacent to one another, each having a straight central hole which constitutes a pore P, substantially perpendicular to the surface of the substrate S.

The end of each cell C that is in a position corresponding to the substrate S has a closing portion having a substantially hemispherical shape, the set of closing portions forming, as a whole, a non-porous part T of the film 1.

The film of porous alumina 1 can be obtained with a controlled morphology by appropriately choosing the electrolyte and the physical, chemical and electrochemical parameters of the process: in acidic electrolytes (such as phosphoric acid, oxalic acid and sulphuric acid) and in adequate process conditions (voltage, current, stirring, and temperature), it is possible to obtain porous films having a high regularity. For this purpose, the dimensions and density of the cells C, the diameter of the pores P and the height of the film of porous alumina 1 can be varied; for example, the typical diameter of the pores P, which is 50–400 nm, can be increased or decreased by means of chemical treatments.

As explained previously, the periodicity of the photonic crystal, and hence the alternation of media with different dielectric constants, produces a photonic band gap and, consequently, does not enable propagation of radiation within a specific waveband and in certain directions. Hence, by controlling the size of and the spacing between the pores P S of the photonic crystal constituted by the film of alumina 1, there can be obtained a band gap in a waveband belonging to the visible spectrum for all the directions of propagation lying in the plane of the substrate.

Figure 2:
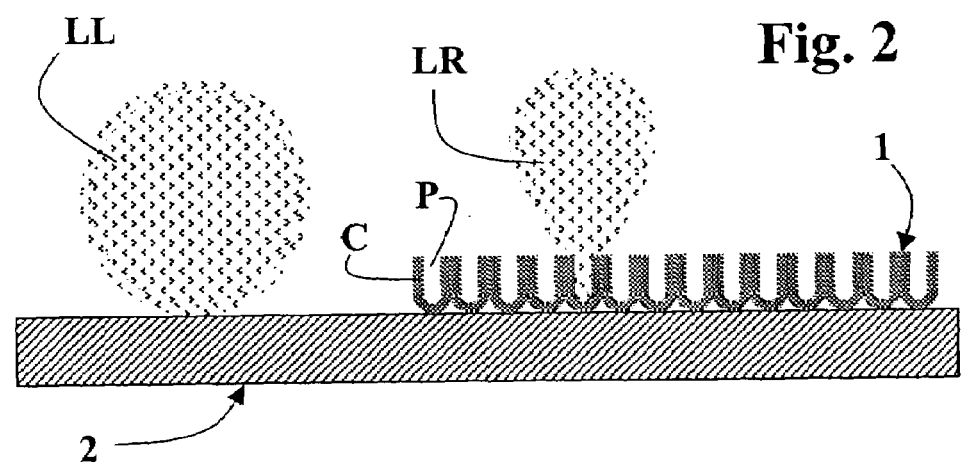
FIG. 2 is a schematic view in lateral cross section of a transparent substrate of a backlight device having a surface partially coated with a film of the same type as the one represented in FIG. 1.

FIG. 2 is a schematic illustration of the effect of directing visible light radiation that can be obtained by applying a film made of porous alumina 1 of a thickness that can range between a few tens of nanometres and a few microns on a portion of the front surface of a transparent substrate or support 2, made, for instance, of glass, which forms part of a backlight device.

Without entering into any detail of said backlight device, we shall assume that the rear surface of the support 2 emits visible radiation with a substantially lambertian emission lobe (for example, on account of organic or inorganic electroluminescent or photoluminescent materials deposited on said surface).

In the absence of the film of alumina, as in the case of the part on the left in FIG. 2, the emission lobe LL of the light emitted from the front surface of the support 2 is still substantially lambertian; however, a considerable fraction of the radiation emitted from the rear surface of the support is unable to come out of the front surface in so far as the angle formed between the direction of propagation and the normal to said surface is greater than the angle of total internal reflection (TIR). Said fraction remains trapped within the plate and propagates by total internal reflection until it reaches the perimeter of the plate itself.

The right-hand part of FIG. 2 shows, instead, how a film of porous alumina 1 inhibits propagation of light in the directions that form with the normal to the surfaces of the support 2 angles greater than the TIR angle, i.e., directions at which total internal reflection would occur. The fraction of radiation corresponding to said directions of propagation is hence converted into radiation, which propagates with angles, with respect to the normal, that are smaller than the TIR angle and substantially manages to come out of the front surface of the plate. The net effect is more light extracted from the backlight device and, at the same time, a narrowing of the emission lobe LR of the light coming out of the front surface of the support. Inhibition of propagation in directions with an angle greater than the TIR angle is linked to the photonic band gap of porous alumina in the plane of the substrate. Inhibition is complete only for directions of propagation lying in the plane of the substrate (i.e., for an angle of 90° with respect to the normal), but the effect extends in a gradually decreasing way also to smaller angles.

According to the invention, by exploitation of said behaviour of porous alumina as photonic crystal, there is proposed the combination of this structured material with light sources in applications in the field of displays and systems for illumination.

Figure 3:
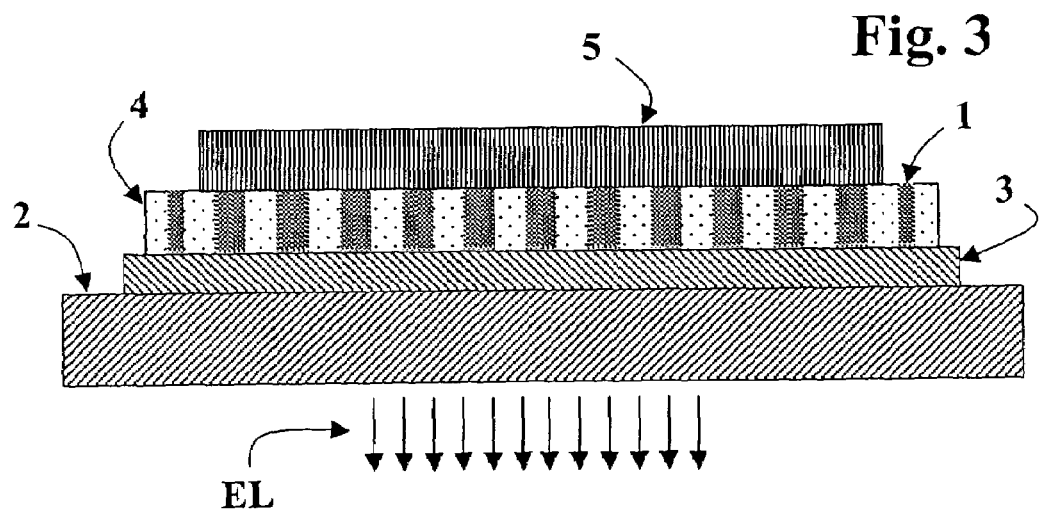
FIGS. 3, 4 and 5 are schematic views in lateral cross section of, respectively, a first, a second and a third backlight device obtained in accordance with the invention.

FIG. 3 illustrates by way of example a first embodiment of a light-emitting device comprising a film of alumina according to the present invention.

As may be noted in the figure, on the rear surface of a transparent support or substrate 2, i.e., the surface opposite to the one through which the light comes out of the device, there is deposited a transparent resistive layer having the function of anode, such as a film of indium tin oxide (ITO) of nanometric thickness, designated by 3. On the surface of the ITO film 3, a film of transparent porous alumina 1 is subsequently obtained, by means of anodization of a layer of aluminium, deposited, for example, by vapour deposition or sputtering.

Once the film of alumina 1 is obtained, the structure of the latter is opened at the base, eliminating the non-porous barrier T illustrated in FIG. 1; this may, for example, be obtained by means of a known etching process. The alumina film 1 is subsequently embedded in a layer 4 of a suitable organic or inorganic electroluminescent material, selected, for example, in the group comprising organic phosphors, inorganic and organic semiconductors, metallic nanocrystals, and luminescent rare earths.

In said embodiment the pores of the alumina film 1, which are in the form of through cavities, are hence filled with electroluminescent material 4.

The device is then completed by depositing a layer 5 of metallic material, having the function of cathode.

Between the electroluminescent material and the electrodes, there may be included other electroluminescent layers and/or charge-transporting layers.

During normal operation of the device, the photonic-crystal structure made with the alumina film 1 directs, according to what has been explained previously, through the support 2 the light radiation generated by the material 4, in such a way that this will come out of the front surface of the support itself in a substantially predetermined direction.

Figure 4:
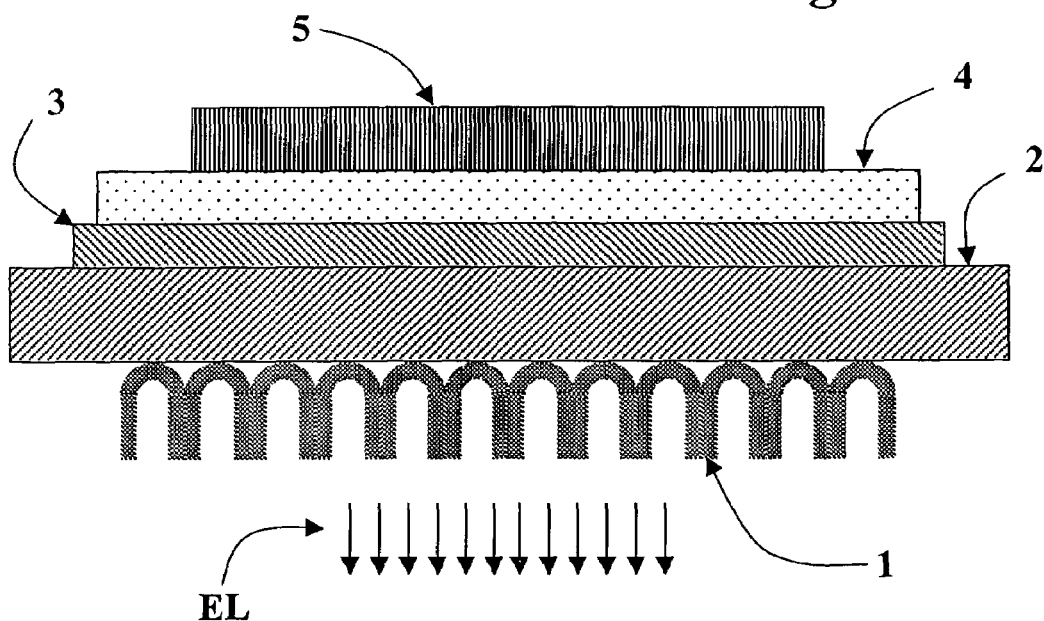

FIG. 4 illustrates a second example of a light-emitting device comprising a film of porous alumina according to the present invention.

In said embodiment, a film of transparent alumina 1 is obtained on the front surface of the substrate or support 2, i.e., the surface through which the light radiation comes out of the device. On the rear surface of the support 2 there is deposited the ITO film 3, on which there are then deposited, in order, the layer of electroluminescent material 4 and the metal layer 3 having the function of cathode. It is to be noted that in this embodiment the non-porous part T of the film of transparent alumina 1 is not removed, the ITO film 3 and the cathode 5 being directly in contact with the layer 4 of electroluminescent material.

In this case, the electromagnetic radiation generated by the material 4 passes through the support 2 and is then emitted from the front surface of the latter. At said surface, the film of transparent alumina 1 inhibits propagation of radiation at angles greater than the TIR angle, thus directing the radiation in the desired direction according to what has been explained previously.

Between the electroluminescent material and the electrodes, there may be included other electroluminescent layers and/or charge-transporting layers.

Figure 5:
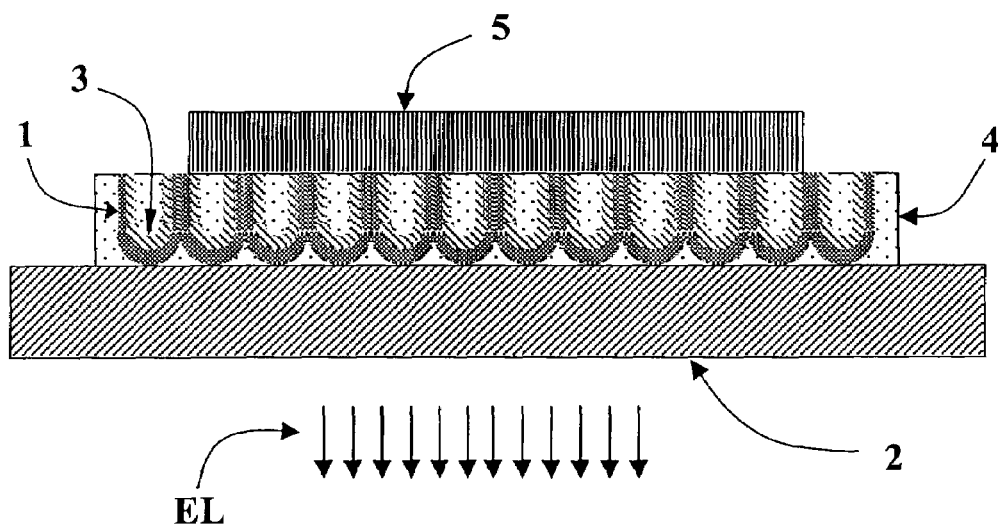

Finally, FIG. 5 illustrates a third example of light-emitting device comprising a film of porous alumina according to the present invention. In said embodiment, on the rear surface of the transparent substrate or support 2, i.e., the surface opposite to the one designed to emit the light, the film of transparent alumina 1 is directly obtained. Next, on the film 1 there is deposited, for example by means of vapour deposition, sputtering or sol-gel, the ITO film 3, so as to coat the internal surfaces of the pores of the anodized alumina. The structure thus obtained is embedded in a layer of electroluminescent material 4, on which there is then laid the metal layer 4 having the function of cathode.

Also in this case, the non-porous part T of the film of transparent alumina 1 is not removed, the ITO film 3 and the cathode 5 being directly in contact with the layer 4 of electroluminescent material.

In a way similar to the case of FIG. 3, during normal operation of the device, the photonic-crystal structure obtained with the alumina film 1 inhibits propagation of radiation at angles greater than the TIR angle, thus directing the radiation generated by the material 4 through the support 2, the said radiation then coming out of the front surface of the latter.

In a way similar to the case of FIG. 3, between the electroluminescent material and the electrodes, there may be included other electroluminescent layers and/or charge-transporting layers.

Of course, without prejudice to the principle of the invention, the details of construction and the embodiments may vary with respect to what is described and illustrated herein, purely by way of example.

For example, it is pointed out that the transparent resistive layer designated above by 3 may be made up of a metallic percolated layer or by a mesoporous oxide, instead of ITO.

The use of anodized porous alumina as a two-dimensional photonic crystal can be envisaged, according to the invention, even in combination with fluorescent lamp bulbs for lighting, in order to inhibit propagation of the light emitted in the directions parallel to the plane of a substrate, and thus improve the efficiency of extraction of light from the substrate itself and increase the directionality of the emitted light. In this perspective, the transparent substrate 2 may consist of the encapsulating glass of a fluorescent lamp bulb.

The light-generating means of the device according to the invention may comprise a layer of photoluminescent phosphors capable of converting UV radiation into visible light.

The transparent substrate 2 may consist of the front glass of a cathode-ray tube (CRT) or of a display of the flat-panel type (FPD).

What is claimed is:

1. A light-emitting device, comprising
a transparent substrate having a front surface and a rear surface, one of said surfaces identifying a plane of the substrate,
means for generating an electromagnetic radiation comprising a first electrode, a second electrode and an electroluminescent material, said means being oriented with respect to said rear surface such that said electromagnetic radiation passes through the substrate to come out of the front surface thereof, and
a layer of porous alumina,
wherein the first and the second electrodes are both in electrical contact with the electroluminescent material, and the layer of porous alumina is structured to inhibit propagation of said electromagnetic radiation in directions parallel to the plane of the substrate, so as to improve the efficiency of extraction of light from the substrate and increase directionality of emitted light.

2. The device according to claim 1, wherein the electroluminescent material is selected from the group consisting of organic electroluminescent materials, inorganic and organic semiconductors, metallic nanocrystals, and luminescent rare earths.

3. The device according to claim 1, wherein said first electrode comprises a first layer of a transparent material and said second electrode comprises a second layer of a transparent material, at least one layer of the electroluminescent material being set between said first and second layers.

4. The device according to claim 3, wherein the layer of alumina is on said front surface and said first layer is on said rear surface.

5. The device according to claim 3, wherein
the first layer is directly in contact with said rear surface, said electroluminescent material is on said first layer; and said second layer is on the electroluminescent material.

6. The device according to claim 3, wherein:
the layer of alumina is on said first layer;
on the ensemble formed by the layer of alumina and the first layer, there is at least one layer of electroluminescent material; and
the layer of alumina is structured in such a way that the electroluminescent material fills the pores of the alumina so as to be in electrical contact both with the first layer and with the second layer.

7. The device according to claim 3, wherein:
the layer of alumina is on said rear surface;
on the layer of alumina there is deposited the first layer so as to coat internal surfaces of pores of the alumina; and
on the ensemble formed by the layer of alumina and the first layer, there is set at least one layer of electroluminescent material, part of which fills the pores of the alumina.

8. The device according to claim 3, wherein the first layer is a layer of ITO or a layer of percolated or mesoporous material.

9. The device according to claim 1, wherein at least one charge-transporting layer is provided between the electroluminescent material and a respective electrode.

10. The device according to claim 1, wherein the transparent substrate is the front glass of a cathode-ray tube (CRT) or of a display of a flat-panel type (FPD).

11. A light-emitting device, in particular a backlight device, comprising
a transparent substrate having a front surface and a rear surface, one of said surfaces identifying a plane of the substrate,
means for generating an electromagnetic radiation, and
a layer of porous alumina, wherein
said means are associated to said rear surface and oriented with respect to said rear surface such that said electromagnetic radiation passes through the substrate to come out of the front surface thereof, and
said layer of porous alumina is on said front surface and is structured to inhibit propagation of said electromagnetic radiation in directions parallel to the plane of the substrate, so as to improve efficiency of extraction of light from the substrate and increase directionality of the emitted light.

12. The device according to claim 11, wherein said generating means comprise a layer of photoluminescent phosphors designed for converting UV radiation into visible light.

13. The device according to claim 11, wherein the transparent substrate is an encapsulating glass of a fluorescent lamp bulb.

14. A light-emitting device having a two-dimensional photonic crystal, a transparent plate with a front surface and a rear surface, as well as means for generating light which are oriented with respect to said rear surface such that said light passes through the plate to come out of the front surface thereof, in order to inhibit propagation of the light in directions parallel to a plane of the transparent plate identified by one of said surfaces, so as to improve efficiency of extraction of light from the plate and increase directionality of the emitted light, wherein the two-dimensional photonic crystal comprises anodized porous alumina.

15. A fluorescent lamp bulb for lighting having a two-dimensional photonic crystal, a transparent plate with a front surface and a rear surface, as well as means for generating light which are oriented with respect to said rear surface such that said light passes through the plate to come out of the front surface thereof, in order to inhibit propagation of the light in directions parallel to a plane of the plate identified by one of said surfaces, so as to improve efficiency of extraction of light from the plate and increase directionality of the emitted light, wherein the two-dimensional photonic crystal comprises anodized porous alumina.

* * * * *